(12) United States Patent  
Aritome

(10) Patent No.: US 7,898,863 B2
(45) Date of Patent: Mar. 1, 2011

(54) METHOD, APPARATUS, AND SYSTEM FOR IMPROVED READ OPERATION IN MEMORY

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 219 days.

(21) Appl. No.: 11/832,513

(22) Filed: Aug. 1, 2007

(65) Prior Publication Data

US 2009/0034337 A1 Feb. 5, 2009

(51) Int. Cl.
*G11C 11/34* (2006.01)
(52) U.S. Cl. .............. 365/185.18; 365/185.33; 365/185.24; 365/185.02
(58) Field of Classification Search ......... 365/185.24, 365/185.02, 185.18, 206, 210.11, 202
See application file for complete search history.

(56) References Cited

U.S. PATENT DOCUMENTS

| 5,867,429 | A * | 2/1999 | Chen et al. ............ 365/185.33 |
| 6,984,547 | B2 | 1/2006 | Prall et al. |
| 7,505,318 | B2 * | 3/2009 | Fukuda et al. ......... 365/185.09 |
| 2006/0203555 | A1 | 9/2006 | Prall |
| 2008/0158985 | A1 * | 7/2008 | Mokhlesi ............... 365/185.21 |

* cited by examiner

*Primary Examiner*—Pho M Luu
*Assistant Examiner*—Tha-O Bui
(74) *Attorney, Agent, or Firm*—Schwegman, Lundberg & Woessner, P.A.

(57) ABSTRACT

Various embodiments include methods, apparatus, and systems for reading an adjacent cell of a memory array in an electronic device to determine a threshold voltage value of the adjacent cell, the adjacent cell being adjacent a target cell, and reading the target cell of the memory array using a wordline voltage value based on the threshold voltage value of the adjacent cell. Additional apparatus, systems, and methods are described.

23 Claims, 13 Drawing Sheets

| VOLTAGE SHIFT DUE TO ADJACENT CELL 410 | VOLTAGE SHIFT DUE TO ADJACENT CELL 430 | VOLTAGE SHIFT DUE TO ADJACENT CELL 411 | VOLTAGE SHIFT DUE TO ADJACENT CELL 421 | VOLTAGE SHIFT DUE TO ADJACENT CELL 431 |
|---|---|---|---|---|
| $V_{SHIFT1}$ | $V_{SHIFT2}$ | $V_{SHIFT3}$ | $V_{SHIFT4}$ | $V_{SHIFT5}$ |
| THRESHOLD VOLTAGE SHIFT VALUE OF TARGET CELL 420 | $V_{SHIFT} = V_{SHIFT1} + V_{SHIFT2} + V_{SHIFT3} + V_{SHIFT4} + V_{SHIFT5}$ | | | |

FIG. 5

| $Vt_{410}$ | $V_{SHIFT1}$ |
|---|---|
| V0 | aV |
| V1 | bV |
| V2 | cV |
| .. | .. |
| VX | dV |

← 601

| $Vt_{430}$ | $V_{SHIFT2}$ |
|---|---|
| V0 | eV |
| V1 | fV |
| V2 | gV |
| .. | .. |
| VX | hV |

← 602

| $Vt_{411}$ | $V_{SHIFT3}$ |
|---|---|
| V0 | iV |
| V1 | jV |
| V2 | kV |
| .. | .. |
| VX | lV |

← 603

| $Vt_{421}$ | $V_{SHIFT4}$ |
|---|---|
| V0 | mV |
| V1 | nV |
| V2 | oV |
| .. | .. |
| VX | pV |

← 604

| $Vt_{431}$ | $V_{SHIFT5}$ |
|---|---|
| V0 | qV |
| V1 | rV |
| V2 | sV |
| .. | .. |
| VX | tV |

← 605

| $Vt_n$ | $V_{SHIFTn}$ |
|---|---|
| Volt | milliVolts |
| 1 | 100 |
| 1.5 | 200 |
| 2 | 300 |
| .. | .. |
| 5 | 800 |

| | INITIAL WORDLINE VOLTAGE VALUE |
|---|---|
| ADJACENT CELL | $VO_{ADJ}$ |
| TARGET CELL | $VO_{TAR} = VO_{ADJ} + V_{SHIFT}$ |

METHOD, APPARATUS, AND SYSTEM FOR IMPROVED READ OPERATION IN MEMORY

FIELD

Embodiments described herein relate to memory devices, including read operations in flash memory devices.

BACKGROUND

Non-volatile memory devices, such as flash memory devices, are used to store data and other kinds of information. Many computers and electronic devices, for example, digital audio players, digital cameras, digital recorders, and cellular phones, have flash memory devices. Flash memory devices may also be used as portable storage devices, such as portable Universal Serial Bus (USB) flash drives or "thumb" drives. Flash memory devices may not need power to maintain the information stored in the device.

A flash memory device stores information in numerous memory cells, which are usually formed in a semiconductor chip. Each of the cells often has a metal-oxide semiconductor (MOS) transistor with two different transistor gates: a control gate and a so-called "floating" gate or FG. The control gate may be used to turn the transistor on and off to control access to the cell. The floating gate may be the place where either one bit or multiple bits of information is stored in each cell.

The value of the information stored in the floating gate may be determined by the amount of electrons or charge in the floating gate. Different amount of electrons in the floating gate may correspond to different values of information. The amount of electrons in the floating gate may be varied by either adding electrons to or extracting electrons from the floating gate.

A flash memory device usually has a programming operation (which is also sometimes referred to as a write operation) to add electrons to the floating gate, and an erase operation to extract electrons from the floating gate. Information in the cells may be read in a read operation. Each cell has a threshold voltage value dependent on the amount of electrons in the floating gate. A read operation determines the threshold voltage value of the cell being read to provide the value of the information stored in the cell.

In some cases, the physical distance among adjacent floating gates of adjacent cells, or the number of electrons in adjacent floating gates, or both, may create floating gate to floating gate (FG-FG) interference among adjacent cells. The FG-FG interference may cause the threshold voltage value of a cell to shift, leading to reduced reliability of information stored in the cell when the information is read.

BRIEF DESCRIPTION OF DRAWINGS

FIG. 5 is a chart showing calculation of shift threshold voltage values of FIG. 4.

FIG. 6 depicts a number of charts showing examples of different threshold voltage values and different shift threshold voltage values according an embodiment of the invention.

DETAILED DESCRIPTION

Figure 1:
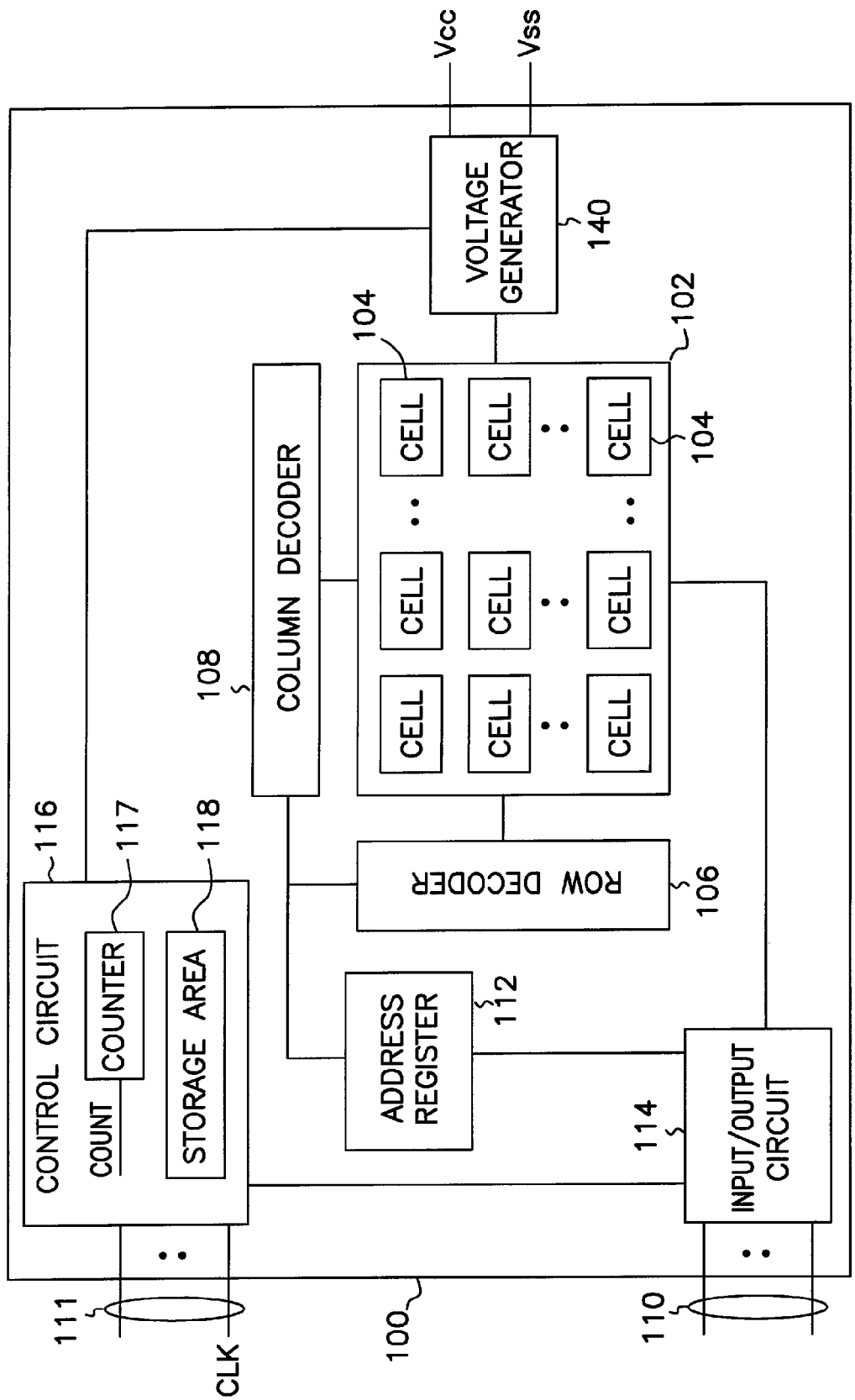
FIG. 1 shows a block diagram of a memory device according to an embodiment of the invention.

FIG. 1 shows a block diagram of an apparatus including a memory device 100 according to an embodiment of the invention. Memory device 100 may include a memory array 102 with memory cells 104 arranged in rows and columns. Row decoder 106 and column decoder 108 may respond to an address register 112 to access cells 104 based on row address and column address signals on terminals 110. A data input/output circuit 114 may transfer data between cells 104 and terminals 110. Terminals 110 and 111 may be external terminals of memory device 100 (e.g., terminals exposed outside a chip or semiconductor package that contain memory device 100). A control circuit 116 may control operations of memory device 100 based on signals present on terminals 110 and 111. The operations may include a programming operation to write data from terminals 110 to cells 104 (e.g., transfer data from terminals 110 to cells 104), a read operation to read data from cells 104 to terminals 110 (e.g., transfer data from cells 104 to terminals 110), and an erase operation to erase data (e.g., clear data) from all cells 104 or from a portion of cells 104.

Memory device 100 may receive voltages Vcc and Vss. Vcc may be the supply voltage for memory device 100, and Vss may be ground. Memory device 100 may also include a voltage generator 140. Voltage generator 140 and control circuit 116 may act separately or together to provide different voltages to memory array 102 or to cause memory array 102 to have different voltages during various operations of memory device 100.

Memory device 100 may include a counter 117 to count the number of signal cycles of a count signal COUNT during a read operation of memory device 100. Based on a count by counter 117, an appropriate voltage value may be used to read cells 104 during the read operation. The function of counter 117 is described in more detail with reference to FIG. 11.

In FIG. 1, the COUNT signal may include a periodic signal (e.g., a clock signal) that may be internally generated by memory device 100. In some embodiments, the COUNT signal may be generated based on a clock signal provided to memory device 100 by an external source. For example, the COUNT signal may include a clock signal CLK or may be generated based on the CLK signal provided to memory device 100 at terminals 111 by another source external from memory device 100.

Memory device 100 may include a storage area 118, which may include storage components such as flash memory cells components, read only memory (ROM) components, registers, or a combination thereof. Storage area 118 may include a hardware portion, a firmware portion, or both, of memory device 100. Storage area 118 may include codes (e.g., software programming instructions) to determine a shift threshold voltage value of one or more target cells of memory device 100. Storage area 118 may also store the shift threshold voltage values of the target cell of memory device 100. The shift threshold voltage value of a target cell is described in more detail below with reference to FIG. 2 through FIG. 13.

A "target cell" as described herein refers to a cell that is selected to be read or intended to be read in response to a command such as a read command. The command to read the target cell may be received at terminals of the memory device, such as terminals 110 or 111 of memory device 100 of FIG. 1. The read command may be sent to the memory device by another device, e.g., by a processor or by a memory controller that is separated from the memory device. The information read from the target cell may be transferred to terminals of the memory device, e.g., terminal 110 of FIG. 1, for further use by another device such as by a processor or a memory controller.

In response to the command to read a target cell, memory device 100 may generate an internal read command (in addition to the original read command) to read an adjacent cell before reading the target cell. Memory device 100 may obtain feedback information when reading the adjacent cell. Then, memory device 100 may read the target cell based on the feedback information. Thus, memory device 100 may operate to read the adjacent cell to obtain feedback information before reading the target cell, without receiving a specific external command (e.g., from a processor or a memory controller) to read the adjacent cell.

Memory device 100 may include a flash memory device. In some embodiments, memory device 100 may include a multi-level cell (MLC) flash memory device. In some embodiments, memory device 100 may include a NAND flash memory device where cells 104 may include flash cells arranged in a NAND flash memory arrangement. One skilled in the art will readily recognize that memory device 100 may include other parts, which are omitted from FIG. 1 to focus on the various embodiments described herein. In some embodiments, memory device 100 may include embodiments of FIG. 2 through 13 described below.

Figure 2:
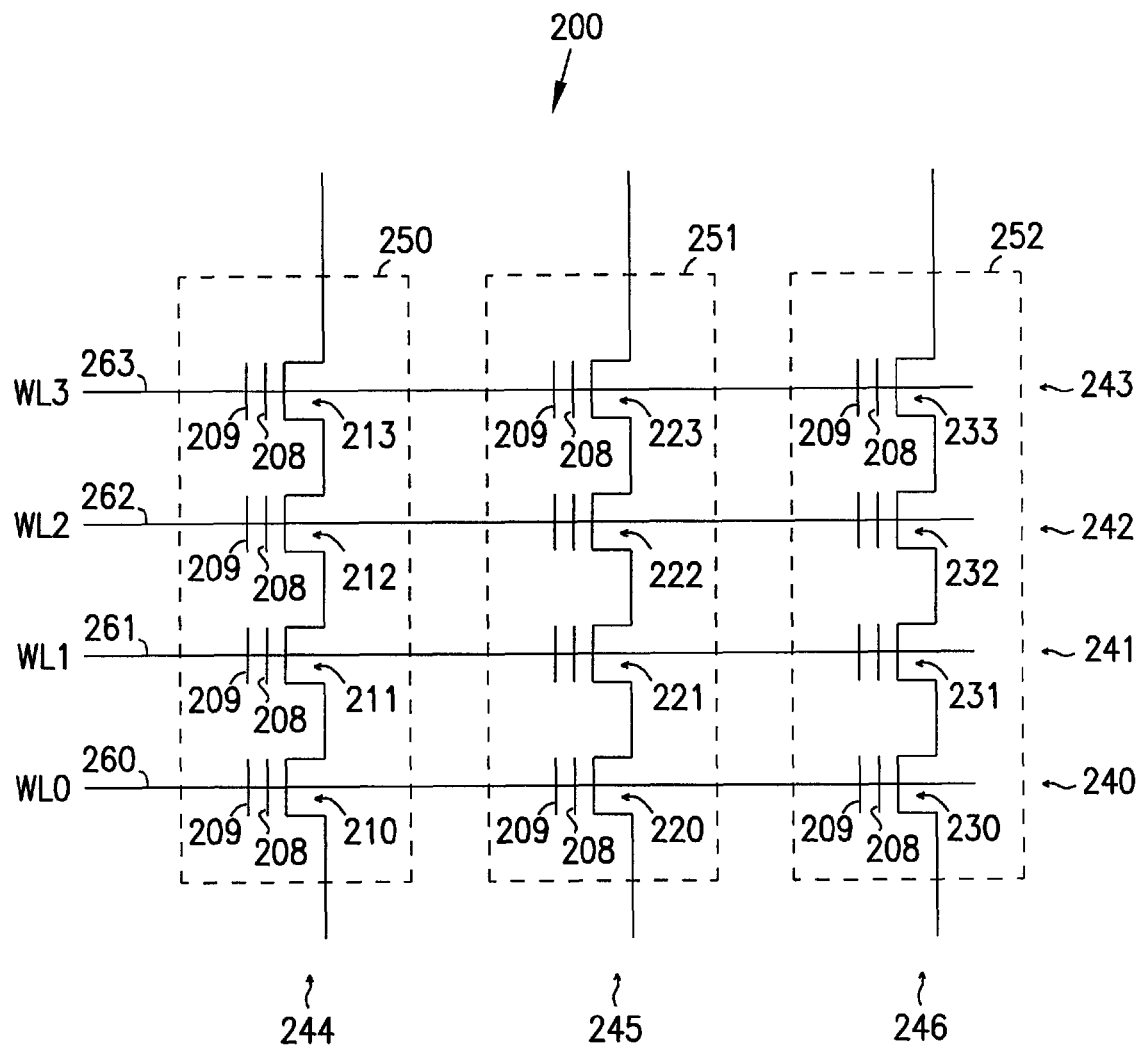
FIG. 2 shows a partial schematic diagram of a memory device according to an embodiment of the invention.

FIG. 2 shows a partial schematic diagram of a memory device 200 according to an embodiment of the invention. Memory device 200 may correspond to memory device 100 of FIG. 1, perhaps forming a portion of the array 102 shown therein. In FIG. 2, memory device 200 may include cells 210, 211, 212, 213, 220, 221, 222, 223, 230, 231, 232, and 233.

In the description of FIG. 2, the term "the cells" (plural), when used without accompanying reference numbers, refers to some or all of cells of a memory device such as cells 210, 211, 212, 213, 220, 221, 222, 223, 230, 231, 232, and 233. Further, the term "the cell" (singular), when used without an accompanying reference number, refers to one of the cells of a memory device such as one of cells 210, 211, 212, 213, 220, 221, 222, 223, 230, 231, 232, and 233.

As shown in FIG. 2, the cells are arranged in rows 240, 241, 242, and 243, and columns 244, 245, and 246. The cells in the same column may be connected in a series (sometimes called a string) of cells, such as strings 250, 251, and 252. FIG. 2 shows an example where each string 250, 251, and 252 may include four cells. In some embodiments, the number of cells in each of strings 250, 251, and 252 may vary.

Each of the cells of FIG. 2 may include a floating gate 208 and a control gate 209. Control gates 209 of cells in the same row (e.g., row 220) may be coupled to one of lines (e.g., wordlines) 260, 261, 262, and 263. Memory device 200 may use lines 260, 261, 262, and 263 to access the cells. Wordline signals (e.g., voltages) WL0, WL1, WL2, and WL3 on lines 260, 261, 262, and 263 may be used to activate the cells to read information in the cells. In an operation, such as read operation, each of wordline signals WL0, WL1, WL2, and WL3 may have different signal levels representing different voltage values on lines 260, 261, 262, and 263. In this description, the term wordline includes a line that a device, such as memory device 100 of FIG. 1 or memory device 200 of FIG. 2, may use the line to access a memory cell of the device. The term wordline voltage includes a voltage applied to a line that is used to access a memory cell associated with that line.

Each floating gate 208 of FIG. 2 may store information in the form of an amount of electrons or charge. Different amount of electrons in the floating gate of each of the cells in FIG. 2 may cause each cell to have a different threshold voltage value. Different threshold voltage values of the cell may represent different values of the information stored in the cell. The threshold voltage value in each of the cells of FIG. 2 may represent a logical value including two or more data bits. For example, in an MLC memory device where each of the cells of FIG. 2 may store four data bits (4 bits per cell), the threshold voltage value in each cell may represent a logical value of one of 16 possible logical combinations of four binary bits.

As mentioned above, FG-FG interference may cause the threshold voltage value (Vt) of a cell to shift (e.g., change in value), leading to a reduced reliability of reading information stored in the cell. The value of the shift in the threshold voltage value of a cell (e.g., a target cell, as mentioned above), due to FG-to-FG interference, is referred to as a shift threshold voltage value or $V_{SHIFT}$.

Figure 3:
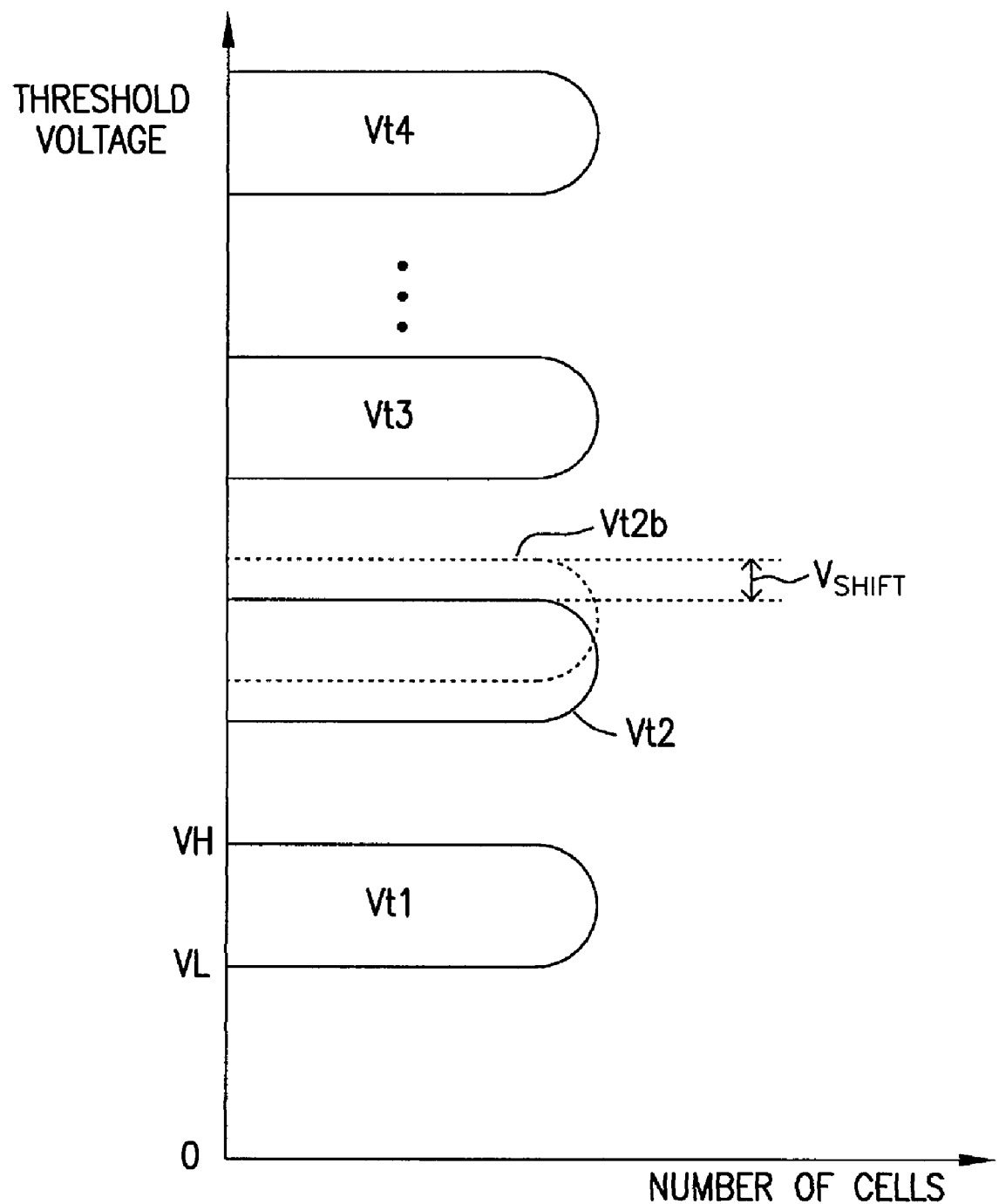
FIG. 3 shows an example of threshold voltage value distribution of the memory device of FIG. 2 including an example of a shift threshold voltage value.

FIG. 3 shows an example of threshold voltage value distribution of memory device 200 of FIG. 2 including an example of a $V_{SHIFT}$. FIG. 3 shows an example of only four different possible threshold voltage values Vt1, Vt2, Vt3, and Vt4. In some embodiments, the number of threshold voltage values may vary. For example, in three bits per cell, the number of threshold voltage values may be eight. In another example, in four bits per cell, the number of threshold voltage values may be 16. Each cell of FIG. 2 may have one of Vt1, Vt2, Vt3, and Vt4 (FIG. 3), depending on the value of the information stored in the cell. As shown in FIG. 3, each of Vt1, Vt2, Vt3, and Vt4 may be within a voltage range (e.g., Vt1 may be between voltage VL and voltage VH).

FIG. 3 shows an example of some of the cells (which may include cell 220, a target cell in this example) of FIG. 2 having a threshold voltage of Vt2, corresponding to some stored value of information. Vt2 may correspond to the original threshold voltage of cell 220. However, due to FG-to-FG interference, Vt2 may be shifted by $V_{SHIFT}$ and become Vt2b. The value of $V_{SHIFT}$ may be determined based on the threshold voltage values of the cells that are adjacent cell 220, such as cells 210, 230, 211, 221, and 231 of FIG. 2.

In FIG. 2, in a read operation, when a memory device 200 receives a command to read a target cell, memory device 200 may read one or more cells adjacent the target cell to obtain feedback information, then memory device 200 may read the target cell based on the feedback information. The feedback information may include information related to $V_{SHIFT}$ of the target cell. For example, when memory device 200 receives a command to read a target cell (e.g., cell 220), memory device 200 may read one or more of the adjacent cells 211, 221, 231, 210, and 230 to obtain $V_{SHIFT}$ of cell 220. Then, memory device 200 reads the target cell, which is cell 220 in this example, based on $V_{SHIFT}$.

As show in FIG. 3, a threshold voltage value of a target cell may shift (e.g., Vt2 of FIG. 2 may shift by $V_{SHIFT}$). Thus, if $V_{SHIFT}$ of the target cell is taken into account when the target cell is read, the effect of the FG-FG may be reduced such that the accuracy or reliability of the information stored in the target cell may be improved. A way to determine $V_{SHIFT}$ of a cell is described in connection with FIG. 4 through FIG. 6.

Figure 4:
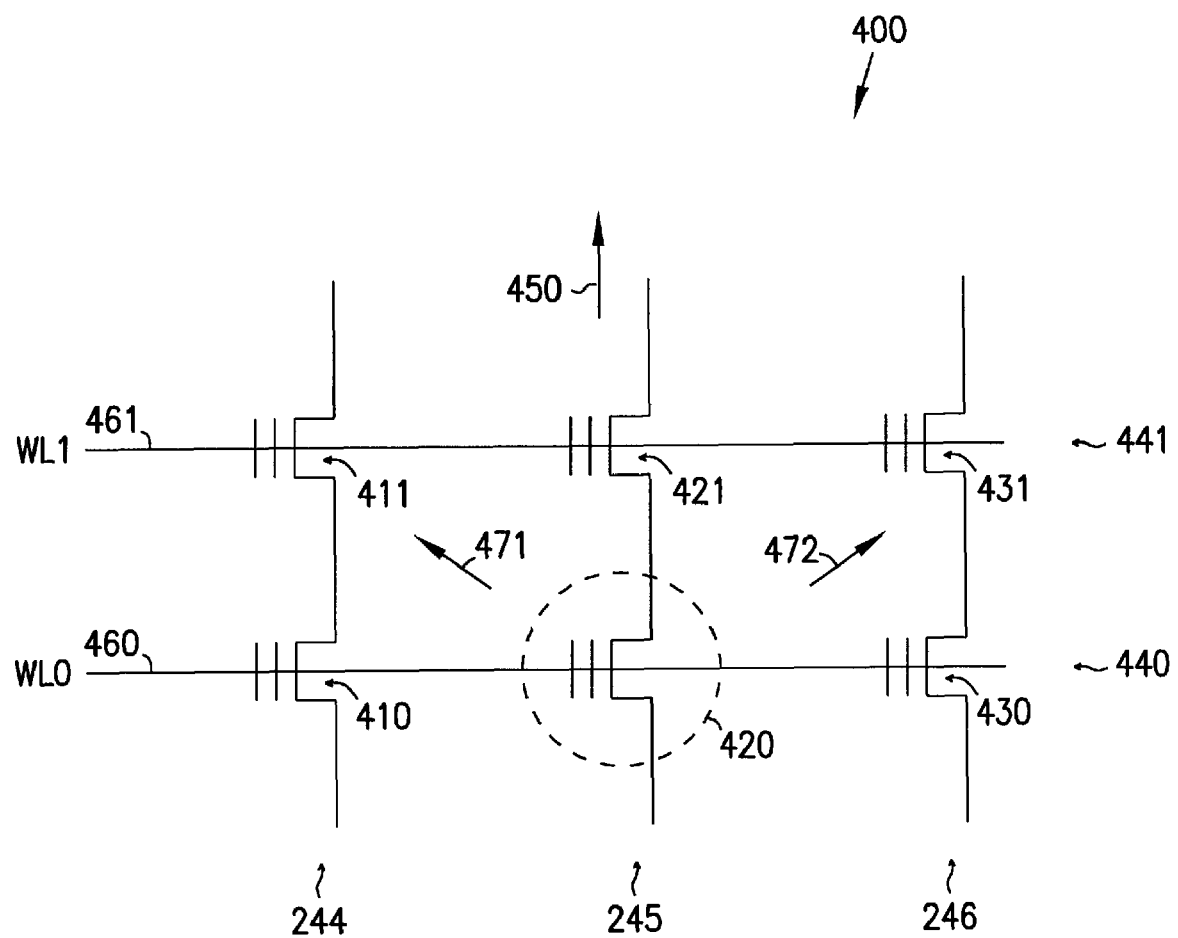
FIG. 4 shows a partial schematic diagram of a memory device depicting a target cell and adjacent cells according an embodiment of the invention.

FIG. 4 shows a partial schematic diagram of a memory device 400 depicting a target cell and adjacent cells according an embodiment of the invention. In some embodiments, memory device 400 may correspond to memory device 100 of FIG. 1. In FIG. 4, memory device 400 may include row 440 having cells 410, 420, and 430 with associated line 460 and wordline signal WL0, and row 441 having cells 411, 421, and 431 with associated line 461 and wordline signal WL1. As shown in FIG. 4, row 440 is adjacent row 441 such that row 440 is located immediately next to row 441.

For purposes of describing a read operation of memory device 400, cell 420 is assumed to be a target cell, and cells 410, 430, 411, 421, and 431 may be called adjacent cells 410, 430, 411, 421, and 431 (which are cells adjacent target cell 420). Memory device 400 may use line 460 to access cells 410, 420 and 430 and line 461 to access cells 411, 421, and 431.

Adjacent cells 410 and 430 may be referred to as wordline adjacent cells, such that adjacent cell 410 is located immediately next to a first side of target cell 420 in row 440, and adjacent cell 430 is located immediately next to a second side of target cell 420 in row 440, each in a wordline direction, along wordline 460. Adjacent cell 421 may be referred to as bit line adjacent cell, such that adjacent cell 421 is located immediately next to target cell 420 in a bit line direction 450. Adjacent cells 411 and 431 may be referred to as diagonally adjacent cells, such that adjacent cell 411 is located diagonally from target cell 420 in a diagonal direction 471, and adjacent cell 431 is located diagonally from target cell 420 in a diagonal direction 472.

In FIG. 4, due to the FG-FG interference, target cell 420 may have a $V_{SHIFT}$ caused by each of adjacent cells 410, 430, 411, 421, and 431.

FIG. 5 is a chart showing calculation of $V_{SHIFT}$ of target cell 420. As shown in FIG. 5, $V_{SHIFT}$ of target cell 420 is a total of $V_{SHIFT1}+V_{SHIFT2}+V_{SHIFT3}+V_{SHIFT4}+V_{SHIFT5}$. $V_{SHIFT1}$ is the shift threshold voltage value of cell 420 caused by cell 410. $V_{SHIFT2}$ is the shift threshold voltage value of target cell 420 caused by adjacent cell 430. $V_{SHIFT3}$ is the shift threshold voltage value of target cell 420 caused by adjacent cell 411. $V_{SHIFT4}$ is the shift threshold voltage value of target cell 420 caused by adjacent cell 421. $V_{SHIFT5}$ is the shift threshold voltage value of target cell 420 caused by adjacent cell 431. Each of $V_{SHIFT1}+V_{SHIFT2}+V_{SHIFT3}+V_{SHIFT4}+V_{SHIFT5}$ may be determined from the charts shown in FIG. 6.

FIG. 6 depicts a number of charts 601, 602, 603, 604, 605, and 606 showing examples of different threshold voltage values and different shift threshold voltage values according an embodiment of the invention. Each of these charts shows a corresponding threshold voltage value of an adjacent cell and a portion of $V_{SHIFT}$ of the target cell 420 caused by each adjacent cell. In chart 601, $V_{SHIFT1}$ may have different voltage values aV, bV, cV, and dV, where V corresponds to a voltage value (e.g., 100 millivolts or some other value), and each of a, b, c, and d corresponds to a real number. The values aV, bV, cV, and dV in chart 601 mean that the threshold voltage value of adjacent cell 420 may be shifted by a voltage amount of aV, bV, cV, or dV, depending on the threshold voltage value of adjacent cell 410 ($Vt_{410}$). V0, V1, V2, and VX in chart 601 correspond to different values of $Vt_{410}$. Thus, as shown in chart 601, when $Vt_{410}$ has a value of V0, the threshold voltage value of target cell 420 ($Vt_{420}$) may be shifted by a voltage amount of aV volts. In another example, when $Vt_{410}$ has a value of V1, $Vt_{420}$ may be shifted by a voltage amount of bV volts. Thus, from chart 601, $V_{SHIFT1}$ may be determined based on $Vt_{410}$. As described above, the threshold voltage value of an adjacent cell, such as $Vt_{410}$, may be determined by reading cell 410 in a read operation.

In chart 601 of FIG. 6, each of aV, bV, cV, and dV of $V_{SHIFT1}$ may be determined (e.g., measured) by the following technique. At a beginning of a measurement, $Vt_{410}$ (Vt of cell 410) and $Vt_{420}$ (Vt of cell 420) may be set to an initial value (e.g., one volt) by an initial programming of cells 410 and 420. Then, the initial value of $Vt_{410}$ may be changed to a different value (e.g., by a second programming of cell 410 with a different threshold voltage value). For example, after $Vt_{410}$ and $Vt_{420}$ are set to an initial value of one volt, $Vt_{410}$ may be increased from one volt to 1.5 volts while $Vt_{420}$ is not increased (e.g., not programming target cell 420 in the second programming operation). After $Vt_{410}$ is increased to 1.5 volts, $Vt_{420}$ may be measured (e.g., by reading target cell 420 after cell 410 is programmed). The shift in $Vt_{420}$ (caused by the change in $Vt_{410}$ from one to 1.5 volts) may be determined by the difference in $Vt_{420}$ before and after $Vt_{410}$ is changed. The result of the measurement may be recorded in a chart such as chart 601. For example, if $Vt_{420}$ shifts from one volt to 1.2 volts when $Vt_{410}$ is changed from one to 1.5 volts, then $V_{SHIFT1}$ is 200 millivolts (1.2 volts minus one volt) corresponding to $Vt_{410}$ of 1.5 volts. Thus, in this example, in chart 601, V0 would be replaced with 1.5 volts and aV would be replaced with 200 millivolts. Following this technique, other values for $V_{SHIFT1}$ in chart 601 may be recorded. Shift threshold voltage values may be positive, zero or negative.

Chart 606 in FIG. 6 shows example threshold voltage values of an adjacent cell (Vtn) and a corresponding $V_{SHIFTn}$ of a target cell caused by that adjacent cell. For example, when the adjacent cell in chart 606 has threshold voltage values of 1, 1.5, 2, or 5 volts, a target cell may be shifted by an amount of 100, 200, 300, or 800 millivolts, respectively. Chart 606 may represent example values of one of charts 601, 602, 603, 604, and 605.

In chart 601, $Vt_{410}$ and $V_{SHIFT1}$ may assume a substantially linear relationship. For example, V0, V1, V2, and VX may have values of 1.5, 2.0, 2.5, and 3.0 volts, respectively, and aV, bV, cV, and dV may have values of 100, 200, 300, and 800 millivolts, respectively.

In each of charts 602, 603, 604, and 605, V0, V1, V2, and VX represent the threshold voltage values of the adjacent cell in that chart.

In chart 602, eV, fV, gV, hV present the shift threshold voltage values of target cell 420 based on threshold voltage values V0, V1, V2, and VX, respectively, of adjacent cell 430.

In chart 603, iV, jV, kV, lV present the shift threshold voltage values of target cell 420 based on threshold voltage values V0, V1, V2, and VX, respectively, of adjacent cell 411.

In chart 604, mV, nV, oV, pV present the shift threshold voltage values of target cell 420 based on threshold voltage values V0, V1, V2, and VX, respectively, of adjacent cell 421.

In chart 605, qV, rV, sV, tV present the shift threshold voltage values of target cell 420 based on threshold voltage values V0, V1, V2, and VX, respectively, of adjacent cell 431.

The shift threshold voltage values (aV, bV, and cV through tV) among charts 601, 602, 603, 604, and 605 may have different values. For example, in chart 601, the shift threshold voltage value aV in chart 601 may be at one value (e.g., 100 millivolts) when V0 in chart 601 is 1.5 volt, but in chart 602, the shift threshold voltage value eV may be a different value (e.g., 80 millivolts) when V0 in chart 601 is 1.5 volt.

Information in each of charts 601, 602, 603, 604, and 605 may be stored using different techniques, such as by software, firmware, hardware, or a combination thereof. For example, in chart 601, each of V0, V1, V2, VX and aV, bV, cV, and dV may be entries of a table with actual number values (i.e., voltage values). The entries may be accessed during the read operation of adjacent cell 410 to find the values of $V_{SHIFT}$ corresponding to a particular threshold voltage value of adjacent cell 410. With software implementation, programming instructions may be used to access entries in the table in the software to determine the shift threshold voltage value of the target cell based on the threshold voltage of the adjacent cell.

In another example, with firmware or hardware implementation, the values of V0, V1, V2, VX and aV, bV, cV, and dV of chart 601 may be stored in the storage area 118 of memory device 100 of FIG. 1. Memory device 400 of FIG. 4 may access the storage area to locate the entries to determine the shift threshold voltage value of the target cell based on the threshold voltage of the adjacent cells. The storage area to store the entries, such as V0, V1, V2, VX and aV, bV, cV, and dV of chart 601, may be included in storage area 118 of memory device 100 of FIG. 1.

In some embodiments, memory device 400 may record the relationship (e.g., linear relationship) between the threshold voltage value of the adjacent cell and the shift threshold voltage value of the target cell, then memory device 400 may calculate (instead of looking up a chart or table for stored values) the value of each of $V_{SHIFT1}$, $V_{SHIFT2}$, $V_{SHIFT3}$, $V_{SHIFT4}$, and $V_{SHIFT5}$ based on the threshold voltage value of each of cells 410, 430, 411, 421, and 431.

Figures 7, 8:
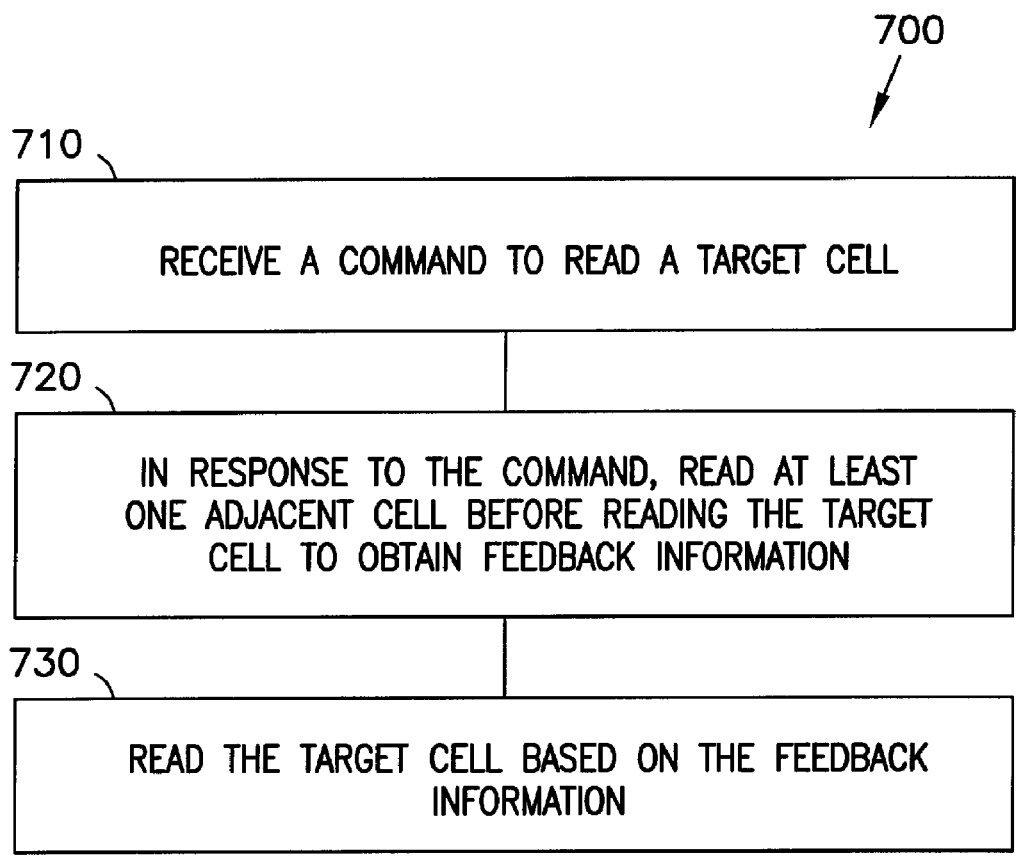
FIG. 7 is a flow diagram showing a method for a read operation of a memory device according an embodiment of the invention.
FIG. 8 is a chart showing a relationship between an initial wordline voltage value used when reading an adjacent cell and an initial wordline voltage value used when reading a target cell according an embodiment of the invention.

FIG. 7 is a flow diagram showing a method 700 for a read operation of memory device 400 according to an embodiment of the invention. The following description refers to FIG. 4 and FIG. 7.

Activity 710 of method 700 in FIG. 7 may include receiving a command to read target cell 420 of memory device 400 of FIG. 4. The command may be received by memory device 400 from another device (e.g., a processor or a memory controller).

Activity 720 of FIG. 7, in response to the command received in activity 710, may include reading at least one of adjacent cells 410, 430, 411, 421, and 431, before reading the target cell, to obtain feedback information. For example, memory device 400 may be configured to read only one of adjacent cells 410, 430, 411, 421, and 431 when a command to read target cell 420 is received. In another example, memory device 400 may be configured to read two, three, four, or all five of adjacent cells 410, 430, 411, 421, and 431 when a command to read target cell 420 is received. If the target cell is included in the center of an array of other cells, even more adjacent cells (e.g., eight) may be read. In any case, a control circuit of memory device 400, similar to or identical to control circuit 116 of memory device 100, may be set to read either one or more than one adjacent cells in response to a command to read a target cell.

The feedback information obtained from reading an adjacent cell may include at least one of $V_{SHIFT1}$, $V_{SHIFT2}$, $V_{SHIFT3}$, $V_{SHIFT4}$, and $V_{SHIFT5}$, as shown in FIG. 6. For example, if only one adjacent cell (e.g., cell 421) is read, then the feedback information includes only $V_{SHIFT4}$ (chart 604). In the case where one adjacent cell 421 is read, the value of $V_{SHIFT4}$ is based on the threshold voltage of adjacent cell 421. For example, if the threshold voltage of adjacent cell 421 is V1, then $V_{SHIFT4}$ is nV. Thus, the feedback information, where one adjacent cell 421 is read, has a value corresponding to nV when the threshold voltage of adjacent cell 421 is V1. In this example, the feedback information (e.g., nV) may be determined by locating an entry in a chart (e.g., chart 604) or a table in memory device 400.

In another example, if three adjacent cells (e.g., cells 411, 421, and 431) are read, then the feedback information is a total of three of $V_{SHIFT1}$, $V_{SHIFT2}$, $V_{SHIFT3}$, $V_{SHIFT4}$, and $V_{SHIFT5}$ (e.g., total $V_{SHIFT3}$, $V_{SHIFT4}$, and $V_{SHIFT5}$).

Each of $V_{SHIFT1}$, $V_{SHIFT2}$, $V_{SHIFT3}$, $V_{SHIFT4}$, and $V_{SHIFT5}$ may be called a feedback voltage value of the feedback information. Thus, depending on the number of adjacent cells read, the feedback voltage value of the feedback information may be either one of $V_{SHIFT1}$, $V_{SHIFT2}$, $V_{SHIFT3}$, $V_{SHIFT4}$, and $V_{SHIFT5}$ or a total of two or more of $V_{SHIFT1}$, $V_{SHIFT2}$, $V_{SHIFT3}$, $V_{SHIFT4}$, and $V_{SHIFT5}$.

In activity 720, after receiving the command to read the target cell, memory device 400 may issue an internal read command to read one or more adjacent cells before reading the target cell. Since memory device 400 may issue an internal read command to read one or more adjacent cells, memory device 400 may read adjacent cells without receiving (e.g., from a processor or a memory controller) a specific external command to read the adjacent cell. After the feedback information is obtained in activity 720, method 700 may continue with activity 730.

Activity 730 may include reading target cell 420 based on the feedback information. In activity 720 described above, to read an adjacent cell (e.g., adjacent cell 421), memory device 400 (FIG. 4) may apply to line 461 wordline signal WL1 with an initial wordline voltage value ($V0_{ADJ}$). In activity 730, to read target cell 420, memory device 400 may apply to line 460 wordline signal WL0 with an initial wordline voltage value ($V0_{TAR}$) different from $V0_{ADJ}$. For example, $V0_{TAR}$ may be approximately equal to the sum of $V0_{ADJ}$ and $V_{SHIFT}$ ($V0_{TAR} = V0_{ADJ} + V_{SHIFT}$). In this description, when two quantities or two sides of an equation are said to be approximately equal (or are said to be equal), it means that a difference of 50 millivolts or less may exist between the two quantities or between two sides of the equation.

FIG. 8 is a chart showing a relationship between an initial wordline voltage value used when reading an adjacent cell and an initial wordline voltage value used when reading a target cell according an embodiment of the invention. As shown in FIG. 8, $V0_{ADJ}$ represents an initial wordline voltage value applied to a wordline associated with an adjacent cell when the adjacent cell is read. For example, when adjacent cell 411, 421, or 431 (line 461, FIG. 4) is read, the initial wordline voltage value $V0_{ADJ}$ (FIG. 8) represents the initial wordline voltage value applied to line 461. In another example, when adjacent cell 410 or 430 (line 460) is read, the initial wordline voltage value $V0_{ADJ}$ (FIG. 8) represents the initial wordline voltage value applied to line 460.

A different initial wordline voltage value may be applied to a wordline associated with the target cell when the target is read. For example, in FIG. 8, $V0_{TAR}$ represents an initial wordline voltage value that may be applied to line 460 (FIG. 4) when target cell 420 is read.

As shown in FIG. 8, the initial wordline voltage value $V0_{TAR}$ is equal to the sum of the initial wordline voltage value $V0_{ADJ}$ and $V_{SHIFT}$. As described in FIG. 7, $V_{SHIFT}$ (e.g., the feedback voltage value of the feedback information) may be either one or a total of two or more of $V_{SHIFT1}$, $V_{SHIFT2}$, $V_{SHIFT3}$, $V_{SHIFT4}$, and $V_{SHIFT5}$.

Figure 9:
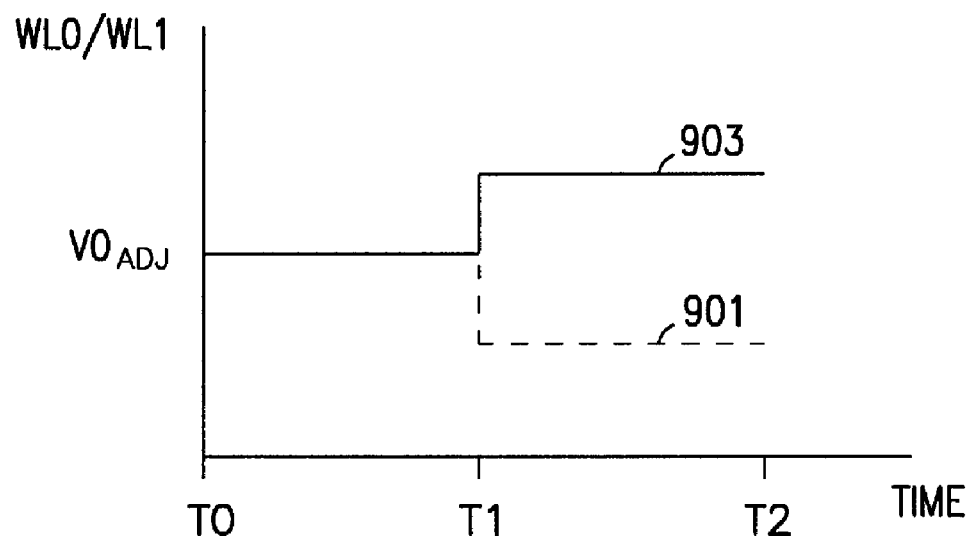
FIG. 9 is a diagram showing an initial wordline voltage value and other voltage values of a wordline associated with an adjacent cell in a read operation according an embodiment of the invention.

FIG. 9 is a diagram showing an initial wordline voltage value and other voltage values of a wordline associated with an adjacent cell in a read operation according an embodiment of the invention. WL0/WL1 in the vertical axis may represent wordline signals (e.g., voltages) WL0 and WL1 of FIG. 4. In FIG. 9, $V0_{ADJ}$, having voltage value 902, may represent an initial wordline voltage applied to a line (e.g., wordline) associated with an adjacent cell.

For example, between times T0 and T1 (FIG. 9), initial wordline voltage $V0_{ADJ}$ may be applied to line 460 (FIG. 4) when adjacent cell 410 or 430 of FIG. 4 is read to determine the threshold voltage value ($Vt_{410}$) of adjacent cell 410 or the threshold voltage value ($Vt_{430}$) of adjacent cell 430. Thus, between times T0 and T1 in FIG. 9, wordline signal WL0 may have initial wordline voltage $V0_{ADJ}$. In some embodiments, if the threshold voltage value ($Vt_{410}$ or $Vt_{430}$) of the adjacent cell being read is unsuccessfully determined between times T0 and T1, then the wordline voltage value of wordline signal WL0 may be increased to an increased voltage value (e.g., voltage value 903) or decreased to a decreased voltage value (e.g., voltage value 901).

In another example, between times T0 and T1, initial wordline voltage $V0_{ADJ}$ may be applied to line 461 when adjacent cell 411, 412, or 431 is read to determine the threshold voltage value (e.g., $Vt_{411}$, $Vt_{421}$, or $Vt_{431}$) of the adjacent cell. Thus, between times T0 and T1, wordline signal WL1 may have initial wordline voltage $V0_{ADJ}$. If the threshold voltage value (e.g., $Vt_{411}$, $Vt_{421}$, or $Vt_{431}$) of the adjacent cell being read is unsuccessfully determined between times T0 and T1, then the wordline voltage value of wordline signal WL1 may be increased to an increased voltage value (e.g., voltage value 903) or decreased to a decreased voltage value (e.g., voltage value 901).

Between times T1 and T2, wordline voltage value of wordline signal WL0 (or WL1) applied to line 460 (or line 461) may be between voltage values 901 and 902 to read the adjacent cell to determine its threshold voltage value. For example, in an MLC memory device where the adjacent cell has one of a number of X possible threshold voltage levels, wordline voltage value of wordline signal WL0, which is applied to line 460 when reading adjacent cell 410, may be changed (increased or decreased) up to X times to determine threshold voltage value of adjacent cell 410. X, as described herein, corresponds to an integer.

Figure 10:
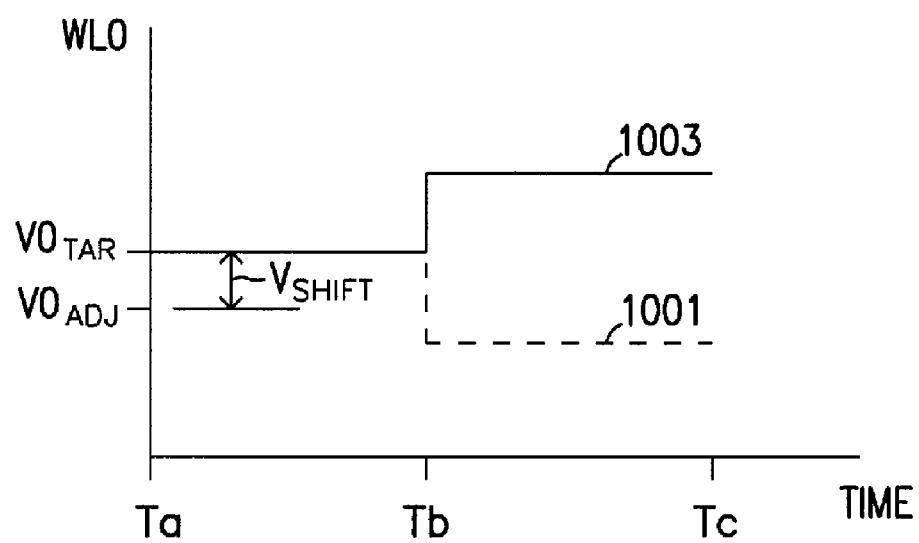
FIG. 10 is a diagram showing an initial wordline voltage value and other voltage values of a wordline associated with a target cell in a read operation according an embodiment of the invention.

FIG. 10 is a diagram showing an initial wordline voltage value and other voltage values of a wordline associated with a target cell in a read operation according to an embodiment of the invention. WL0 in the vertical axis may represent wordline signal or voltage WL0 of FIG. 4. $V0_{TAR}$, having voltage value 1002, may represent an initial wordline voltage applied to a wordline associated with a target cell. For example, between times Ta and Tb of FIG. 10, initial wordline voltage $V0_{TAR}$ may be applied to line 460 of FIG. 4 when target cell 420 is read to determine the threshold voltage value ($Vt_{420}$) of target cell 420. Thus, between times Ta and Tb, wordline signal WL0 may have initial wordline voltage $V0_{TAR}$.

As shown in FIG. 10, initial wordline voltage $V0_{TAR}$ is greater than $V0_{ADJ}$ by an amount of $V_{SHIFT}$. Thus, the initial wordline voltage $V0_{TAR}$ is equal to the sum initial wordline voltage $V0_{ADJ}$ and $V_{SHIFT}$. The time interval between Ta and Tb may occur after the time interval between T1 and T2 (FIG. 9).

In FIG. 10, between times Ta and Tb, if the threshold voltage value (e.g., $Vt_{420}$) of the target cell is unsuccessfully determined, then the wordline voltage value of wordline signal WL0 may be increased to an increased voltage value (e.g., voltage value 1003) or decreased to a decreased voltage value (e.g., voltage value 1001). Between times Tb and Tc, wordline voltage value of wordline signal WL0 applied to line 460 of FIG. 4 may be between voltage values 1001 and 1002 to read target cell 420 to determine its threshold voltage value.

Each of the cells in FIG. 4 may be associated with multiple logical pages in which each of the multiple pages may correspond to a threshold voltage value of the cell. For example, in four bits per cell (each cell may store information representing a combination of four binary bits), each of the cells in FIG. 4 may be associated with 16 logical pages corresponding to 16 threshold voltage values of the cell. Thus, target cell 420 of FIG. 4 may be associated with multiple logical pages. In FIG. 10, the multiple logical pages associated with target cell 420 may be read using different wordline voltage value. For example, if the threshold voltage value (e.g., $Vt_{420}$) of the target cell 420 is unsuccessfully determined in one read, then in another read, wordline voltage WLN may be changed from first voltage value (e.g., $V0_{TAR}$) to a second voltage value (e.g., one of voltage values 1001 and 1103) between reading the first logical page (e.g., one of the 16 logical pages) associated with target cell 420 and reading the second logical page (e.g., another one of the 16 logical pages) associated with target cell 420.

Figure 11:
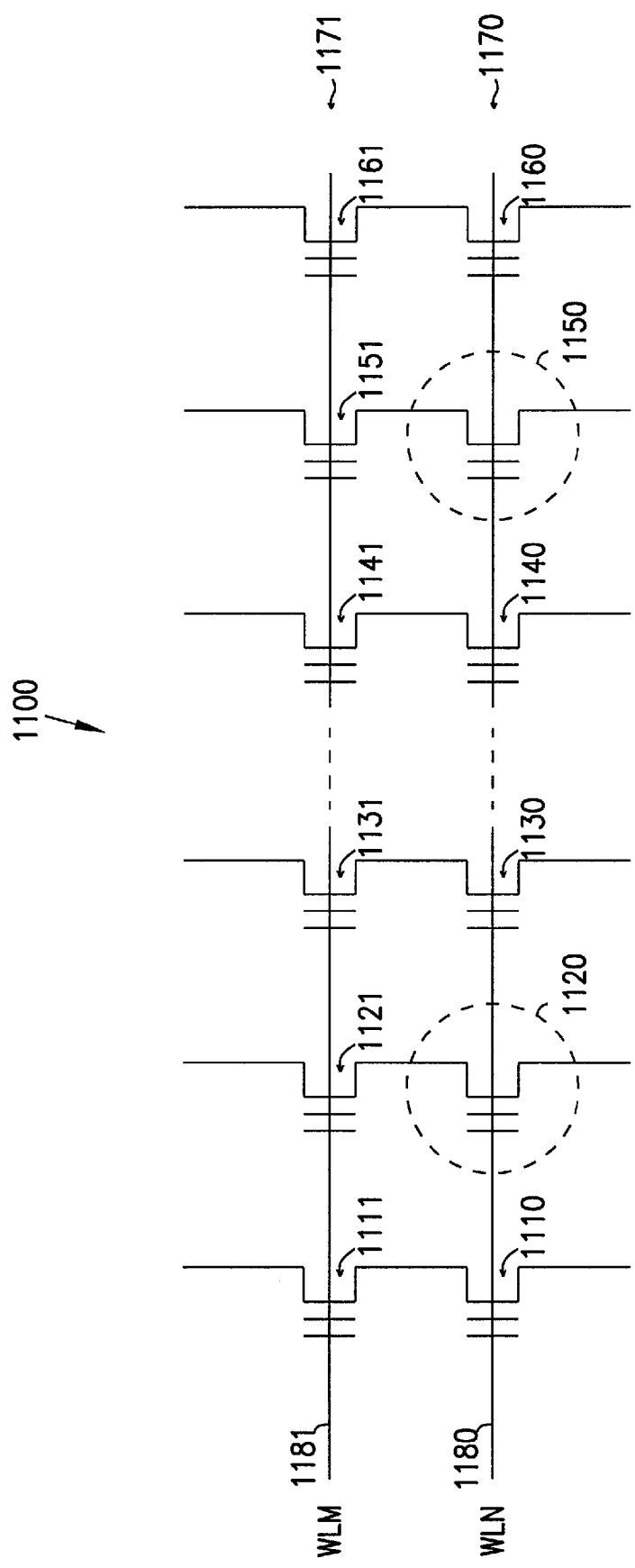
FIG. 11 shows a partial schematic diagram of a memory device with multiple target cells according an embodiment of the invention.

FIG. 11 shows a partial schematic diagram of a memory device 1100 with multiple target cells according an embodiment of the invention. In some embodiments, memory device 1100 may correspond to memory device 100 of FIG. 1. In FIG. 11, memory device 1100 may include row 1170 having cells 1110, 1120, 1130, 1140, 1150, and 1160 with associated line 1180 and wordline signal WLN, and row 1171 having cells 1111, 1121, 1131, 1141, 1151, and 1161 with associated line 1181 and wordline signal WLM. As show in FIG. 11, row 1170 is adjacent row 1171 such that row 1170 is located immediately next to row 1171.

For purposes of describing a read operation of memory device 1100, cells 1120 and 1150 are assumed to be target cells. Since cells 1110, 1130, 1111, 1121, and 1131 are adjacent target cell 1120, cells 1110, 1130, 1111, 1121, and 1131 may be called adjacent cells or a first group of adjacent cells. Since cells 1140, 1160, 1141, 1151, and 1161 are adjacent target cell 1150, cells 1140, 1160, 1141, 1151, and 1161 may also be called adjacent cells or a second group of adjacent cells. Memory device 1100 may use line 1180 to access cells 1110, 1120, 1130, 1140, 1150, and 1160 and line 1181 to access cells 1111, 1121, 1131, 1141, 1151, and 1161.

Figure 12:
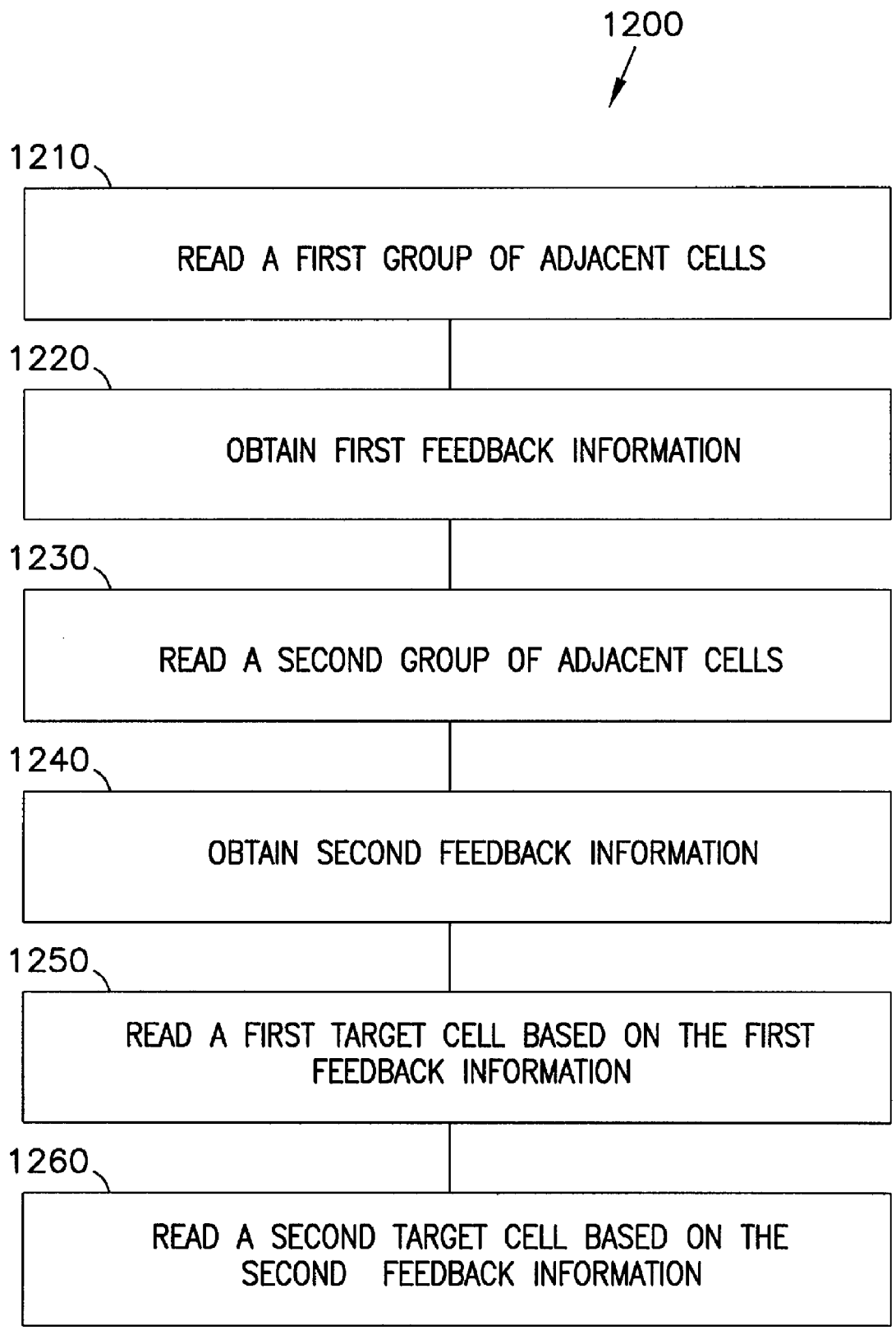
FIG. 12 is a flow diagram showing a method for a read operation to read multiple target cells according an embodiment of the invention.

FIG. 12 is a flow diagram showing a method 1200 for a read operation of memory device 1100 according to an embodiment of the invention. The following description refers to FIG. 11 and FIG. 12.

Activity 1210 may include reading the group of adjacent cells 1110, 1130, 1111, 1121, and 1131. Memory device 1100 may read the group of adjacent cells 1110, 1130, 1111, 1121, and 1131 in response to the command to read target cell 1120. The command may be sent to memory device 1100 by another device. In some embodiments, activity 1210 may include reading fewer than all cells in the group of adjacent cells

1110, 1130, 1111, 1121, and 1131. For example, activity 1210 may include reading only cells 1111, 1121, and 1131.

Activity 1220 may include obtaining first feedback information. The first feedback information may be obtained by determining a shift threshold voltage value of target cell 1120 based on the threshold voltage values of the adjacent cells that are read as part of activity 1210. Thus, the first feedback information may include a feedback voltage value, which is the shift threshold voltage value of target cell 1120, or $V_{SHIFT}$ of target cell 1120, based on the on the threshold voltage value of the adjacent cells that are read as part of activity 1210. $V_{SHIFT}$ of target cell 1120 in method 1200 may be determined in a method similar to that described above with reference to FIG. 4 through FIG. 8.

Activity 1230 may read the group of adjacent cells 1140, 1160, 1141, 1151, and 1161. Memory device 1100 may operate to read the group of adjacent cells 1140, 1160, 1141, 1151, and 1161 in response to the command to read target cell 1150. In some embodiments, activity 1230 may include reading fewer than all cells in the group of adjacent cells 1140, 1160, 1141, 1151, and 1161. For example, activity 1230 may read only cells 1141, 1151, and 1161.

Activity 1240 may include obtaining second feedback information. The second feedback information may be obtained by determining a shift threshold voltage value of target cell 1150 based on the threshold voltage values of the adjacent cells that are read as part of activity 1230. Thus, the second feedback information may include a feedback voltage value, which is the total of the shift threshold voltage value of target cell 1150, or $V_{SHIFT}$ of target cell 1150, based on the threshold voltage value of the adjacent cells that are read as part of activity 1230. $V_{SHIFT}$ of target cell 1150 in method 1200 may be determined in a method similar to that described above with reference to FIG. 4 through FIG. 8.

Activity 1250 may include reading target cell 1120 based on the first feedback information obtained from activity 1220. Memory device 1100 (FIG. 11) may operate to apply to line 1180 wordline signal WLN with an initial wordline voltage value $V0_{TAR}=V0_{ADJ}1+V_{SHIFT}$ of target cell 1120, where $V0_{ADJ}1$ corresponds to an initial wordline voltage value when reading each of 1110, 1130, 1111, 1121, and 1131.

Activity 1260 may include reading target cell 1150 based on the second feedback information obtained from activity 1240. Memory device 1100 may operate to apply to line 1180 wordline signal WLN with an initial wordline voltage value $V0_{TAR}=V0_{ADJ}2+V_{SHIFT}$ of target cell 1150, where $V0_{ADJ}2$ corresponds to an initial wordline voltage value when reading each of 1140, 1160, 1141, 1151, and 1161. Initial wordline voltage value $V0_{ADJ}1$ may be equal to initial wordline voltage value $V0_{ADJ}2$. However, $V_{SHIFT}$ of target cell 1120 may be unequal to $V_{SHIFT}$ of target cell 1150.

Figure 13:
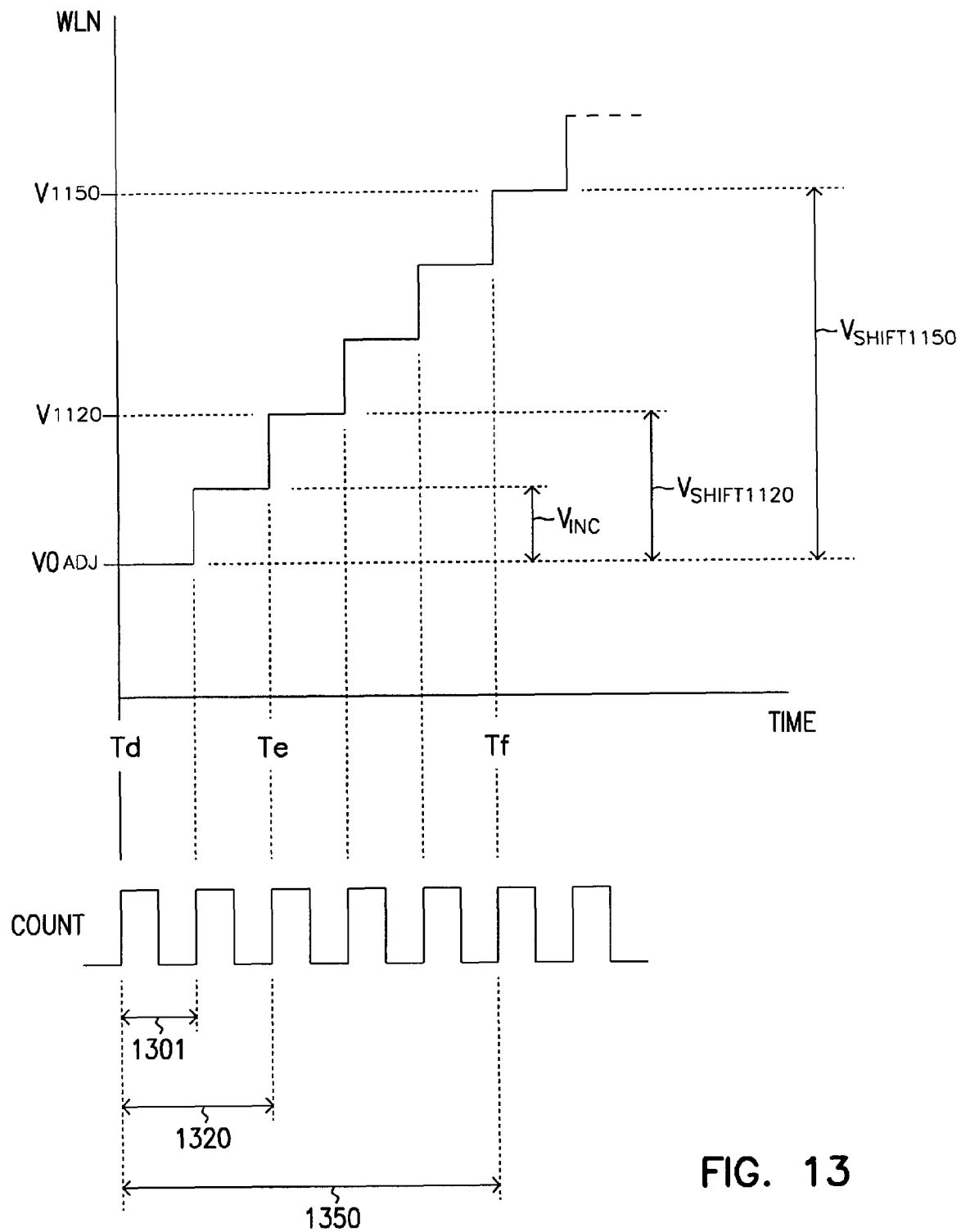
FIG. 13 is an example timing diagram showing wordline voltage values applied at wordlines of the multiple target cells of FIG. 11.

FIG. 13 is an example timing diagram showing wordline voltage values applied to wordlines of the multiple target cells 1120 and 1150 of FIG. 11. WLN in the vertical axis represents wordline signal WLN of FIG. 11. $V_{1120}$ represents a wordline voltage value at which target cell 1120 is read. $V_{1150}$ represents a wordline voltage value at which target cell 1150 is read. Initial wordline voltage value $V0_{ADJ}$ represents $V0_{ADJ}1$ or $V0_{ADJ}2$ that may be used to read an adjacent of the first or second group of adjacent cells to obtain the threshold voltage value of the adjacent cell, as described above with reference to FIG. 12.

As shown in FIG. 13, $V_{1120}$ may be equal to the sum of $V0_{ADJ}$ and $V_{SHIFT1120}$ ($V_{SHIFT}$ of target cell 1120). $V_{1150}$ may be equal to the sum of $V0_{ADJ}$ and $V_{SHIFT1150}$ ($V_{SHIFT}$ of target cell 1150).

As shown in FIG. 13, wordline signal or voltage WLN may be increased step-wise, such that the voltage value of wordline signal WLN may be increased by an equal amount of $V_{INC}$ after each signal cycle 1301 of a count signal COUNT. Memory device 1100 may operate to generate the COUNT signal internally or receive the COUNT signal from an external clock source. In some embodiments, the COUNT signal may include a clock signal in which the clock signal may be internally generated by the memory device 1100 or may be provided to memory device 1100 by an external source.

In FIG. 13, wordline signal WLN may start at a voltage value $V0_{ADJ}$ at time Td, then target cell 1120 may be read when wordline signal WLN reaches voltage value V1120 at time Te. A counter of memory device 1100, such as counter 117 of FIG. 1, may count the number of signal cycles of the COUNT signal starting from time Te. Target cell 1120 may be read when the count (or the number of signal cycles of the COUNT signal) reaches a quantity corresponding to time Te. Similarly, target cell 1150 may be read when the count (or the number of signal cycles of the COUNT signal) reaches another quantity corresponding to time Tf. In some embodiments, the number of signal cycles of the COUNT signal during time interval 1320, between times Td and Te, may be determined by dividing $V_{SHIFT1120}$ by $V_{INC}$. In some embodiments, the number of signal cycles of the COUNT signals during time interval 1350, between times Td and Tf, may be determined by dividing $V_{SHIFT1150}$ by $V_{INC}$.

Figure 14:
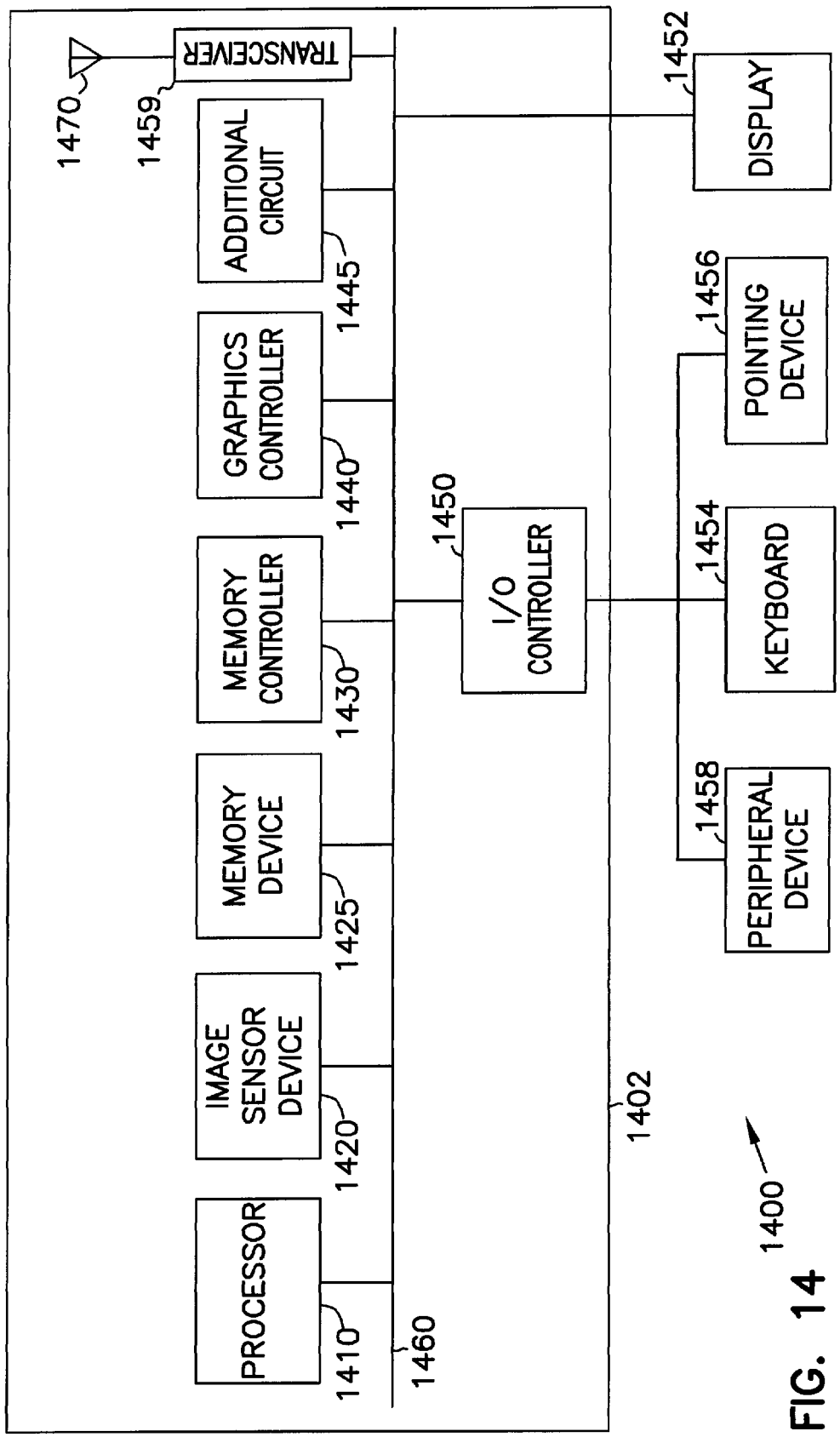
FIG. 14 shows a block diagram of a system according an embodiment of the invention.

FIG. 14 shows a system 1400 according to an embodiment of the invention. System 1400 may include a processor 1410, an image sensor device 1420, a memory device 1425, a memory controller 1430, a graphics controller 1440, an additional circuit 1445, an input and output (I/O) controller 1450, a display 1452, a keyboard 1454, a pointing device 1456, a peripheral device 1458, a transceiver 1459, a bus 1460 to transfer information among the components of system 1400, and an antenna 1470 to wirelessly transmit and receive information to and from system 1400. Transceiver 1459 may perform a transferring of information from one or more the components of system 1400 (e.g., at least one of processor 1410 and memory device 1430) to antenna 1470. Transceiver 1459 may also perform a transferring of information received at antenna 1470 to at least one of the processor and the flash memory device. The information received at antenna 1470 may be transmitted to system 1400 by a source external to system 1400.

Processor 1410 may include a general-purpose processor or an application specific integrated circuit (ASIC). Processor 1410 may include a single core processor or a multiple-core processor. Processor 1410 may execute one or more programming commands to process information. The information may include digital output information provided by other components of system 1400, such as by image sensor device 1420 or memory device 1425.

Image sensor device 1420 may include a complementary metal-oxide-semiconductor (CMOS) image sensor having a CMOS pixel array or charge-coupled device (CCD) image sensor having a CCD pixel array.

Memory device 1425 may include a volatile memory device, a non-volatile memory device, or a combination of both. For example, memory device 1425 may comprise a dynamic random access memory (DRAM) device, a static random access memory (SRAM) device, a flash memory device, or a combination of these memory devices. In some embodiments, memory device 1425 may include one or more embodiments of the invention, as shown and described with respect to FIG. 1 through FIG. 13 (e.g., memory devices 100, 200, 400, or 1100).

Display 1452 may include an analog display or a digital display. Display 1452 may receive information from other components. For example, display 1452 may receive information that is processed by one or more of image sensor device 1420, memory device 1425, graphics controller 1440, and processor 1410 to display information such as text or images.

Additional circuit 1445 may include a circuit components used in a vehicle. Additional circuit 1445 may receive information from other components to activate one or more subsystem of the vehicle. For example, additional circuit 1445 may receive information that is processed by one or more of image sensor device 1420, memory device 1425, and processor 1410, to activate one or more of an air bag system of a vehicle, a vehicle security alarm, and an obstacle alert system.

The illustrations of apparatus such as memory devices 100, 200, 400, and 1100, and systems such as embodiments of system 1400 are intended to provide a general understanding of the structure of various embodiments, and not as a complete description of all the elements and features of apparatus and systems that might make use of the structures described herein.

Any of the components previously described can be implemented in a number of ways, including simulation via software. Thus, apparatus such as memory devices 100, 200, 400, and 1100, and systems such as embodiments of system 1400 described above may all be characterized as "modules" herein. Such modules may include hardware circuitry, single and/or multi-processor circuits, memory circuits, software program modules and objects, and/or firmware, and combinations thereof, as desired by the architect of the apparatus such as memory devices 100, 200, 400, and 1100, and systems such as embodiments of system 1400, and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate, or simulate the operation of various potential embodiments.

The novel apparatus and systems of various embodiments may include or be included in electronic circuitry used in high-speed computers, communication and signal processing circuitry, single or multi-processor modules, single or multiple embedded processors, multi-core processors, data switches, and application-specific modules including multi-layer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Figure 15:
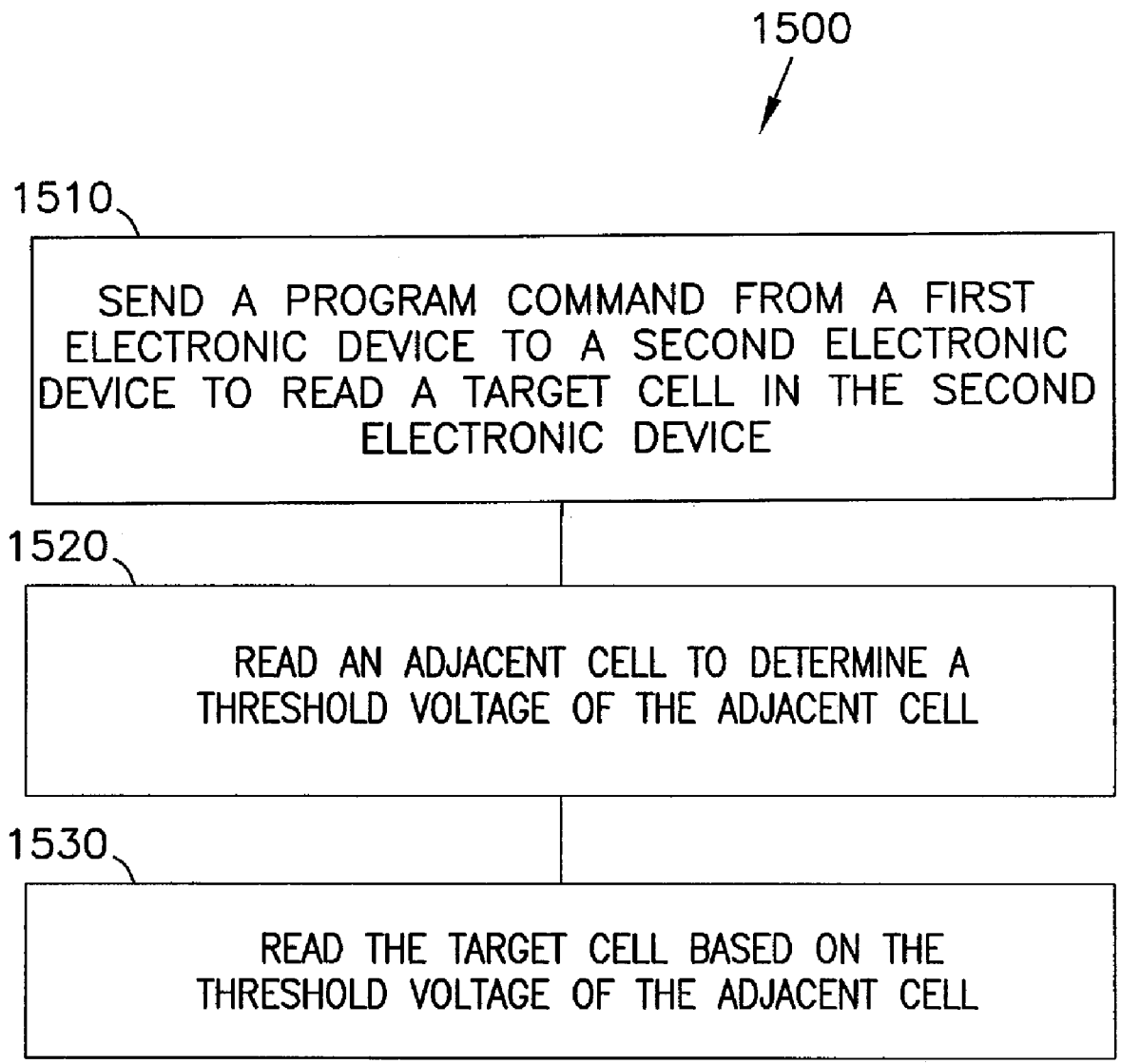
FIG. 15 is a flow diagram showing a method for a read operation in a system according an embodiment of the invention.

FIG. 15 shows a flow diagram showing a method 1500 for a read operation in a system according to an embodiment of the invention. Activity 1510 may send a program command (e.g., a read command) from a first electronic device to a second electronic device to read a target cell in the second electronic device. The first electronic device in method 1500 may include a component of a system, such as processor 1410, memory controller 1430, graphics controller 1440, additional circuit 1445, or I/O controller 1450 of system 1400 of FIG. 14. The second electronic device in method 1500 may include a component of a system, such as memory device 1425 or image sensor device 1420 of system 1400 of FIG. 14.

In activity 1510, the first electronic device may send the second electronic device the program command to read the target cell, without sending the second electronic device a second program command (e.g., a read command) to read one or more adjacent cells adjacent the target cell.

Activity 1520 may include reading one or more adjacent cells to determine a threshold voltage value of the adjacent cell.

Activity 1530 may include reading the target cell based on the threshold voltage value of the adjacent cell(s). For example, activity 1530 may include applying a wordline voltage value to a wordline associated with the target cell to read the target cell, in which the wordline voltage value may include a shift threshold voltage value of the target cell based on the on the threshold voltage value of the adjacent cell(s).

Method 1500 may include one or more activities of method 700 and 1200 described above with reference to FIG. 7 and FIG. 12.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A method, comprising:
reading fewer than all cells in a group of adjacent cells of a memory array to obtain feedback information, the adjacent cells being adjacent a target cell, wherein the feedback information is obtained by determining a shift threshold voltage value of the target cell based at least in part on a threshold voltage value of at least one cell in the group of adjacent cells and, wherein a number of the group of adjacent cells is equal to five; and reading the target cell of the memory array based on the feedback information.

2. The method of claim 1, wherein determining the shift threshold voltage value comprises:
calculating the shift threshold voltage value based on the threshold voltage value of the at least one cell in the group of adjacent cells.

3. The method of claim 2, wherein the calculating assumes a linear relationship between the shift threshold voltage value and the threshold voltage value of the at least one cell in the group of adjacent cells.

4. The method of claim 1, wherein reading fewer than all cells in the group of adjacent cells comprises:
applying a voltage with a first voltage value to a line used to access at least one cell in the group of adjacent cells to determine the threshold voltage value of the at least one cell in the group of adjacent cells; and changing the first voltage value to a second voltage value when the threshold voltage value of the at least one cell in the group of adjacent cells is unsuccessfully determined.

5. The method of claim 4, wherein reading the target cell comprises:
applying an additional voltage to a line used to access the target cell, wherein the additional voltage has a voltage value approximately equal to a sum of the shift threshold voltage value and the first voltage value.

6. The method of claim 5, wherein the threshold voltage value of the at least one cell in the group of adjacent cells is represented by a logical value having at least two data bits.

7. A method comprising:
reading fewer than all cells in a first group of adjacent cells of a memory array, the first group of adjacent cells being adjacent a first target cell, wherein a number of the first group of adjacent cells is equal to five;
obtaining first feedback information from reading fewer than all cells in the first group of adjacent cells;
reading fewer than all cells in a second group of adjacent cells of the memory array, the second group of adjacent cells being adjacent a second target cell, wherein a number of the second group of adjacent cells is equal to five;
obtaining second feedback information from reading fewer than all cells in the second group of cells;
reading the first target cell of the memory array using a voltage with a first voltage value based on the first feedback information; and
reading the second target cell of the memory array using the voltage with a second voltage value based on the second feedback information.

8. The method of claim 7, wherein obtaining the first feedback information comprises determining a first voltage shift of a threshold voltage of the first target cell based on a threshold voltage of at least one cell in the first group of adjacent cells, and wherein obtaining the second feedback information comprises determining a second voltage shift of a threshold voltage of the second target cell based on a threshold voltage of at least one cell in the second group of adjacent cells.

9. The method of claim 8, wherein the first and second target cells are located in a row of the memory array, and wherein reading the first and second target cells comprises:
applying to a line used to access the first and the second target cells the voltage with an initial voltage value lower than the first voltage value;
increasing the voltage;
reading the first target cell when the voltage reaches the first voltage value; and
reading the second target cell when the voltage reaches a second voltage value greater than the first voltage value.

10. The method of claim 9 comprising:
counting a number of signal cycles of a count signal, wherein the first target cell is read when the number reaches a first quantity, and wherein the second target cell is read when the number reaches a second quantity.

11. An apparatus comprising:
a memory array comprising cells, the cells including a group of first cells and a second cell, wherein the group of first cells are located in only two rows in the memory array, wherein the two rows are coupled to different lines used to access the group of first cells; and
a module coupled to the memory array, the module configured to read at least one cell in the group of first cells to determine a first threshold voltage value of the at least one cell in the group of first cells when the second cell is selected to be read, and the module configured to read the second cell using a voltage with voltage value based on the first threshold voltage value.

12. The apparatus of claim 11, wherein the group of first cells and the second cell are configured to store a logical value having multiple data bits.

13. The apparatus of claim 11, wherein the circuit is configured to apply an additional voltage to a first line included in the two lines used to access the at least one cell in the group of first cells when reading the at least one cell in the group of first cells, and to apply the voltage to a second line included in the two lines used to access the second cell when reading the second cell, and wherein the voltage has an initial voltage value greater than an initial voltage value of the additional voltage.

14. The apparatus of claim 13 comprising:
a counter configured to count a number of signal cycles of a count signal, wherein the number is zero when the initial voltage value applied to the first line is equal to the initial voltage value applied to the second line.

15. The apparatus of claim 13, wherein the initial voltage value of the additional voltage is approximately equal to a ground voltage potential.

16. An apparatus comprising:
a memory array comprising cells; and
a module coupled to the memory array, the module configured to read a group of cells among the cells when a target cell among the cells is selected to be read, the module configured to obtain feedback information from reading the group of cells, and the module configured to read the target cell among the cells based on the feedback information, wherein the group of cells are located in only two rows in the memory array, wherein the two rows are coupled to different lines used to access the group of cells.

17. The apparatus of claim 16, wherein the feedback information comprises a sum of voltage shifts of a threshold voltage of the target cell, and wherein each of the voltage shifts is determined based on a threshold voltage of each cell of the group of cells.

18. The apparatus of claim 17, comprising:
a storage area configured to store entries, wherein each of the entries comprises an indication of each of the voltage shifts based on a threshold voltage of one cell of the group of cells.

19. The apparatus of claim 17 comprising:
a storage area configured to store programming codes to determine a voltage value of each of the voltage shifts based on a threshold voltage of one cell of the group of cells.

20. The apparatus of claim 16, comprising:
a counter configured to count a number of signal cycles of a count signal, wherein the circuit is configured to read the second cell when the number reaches a selected quantity.

21. The apparatus of claim 16, wherein the target cell is located in a first row of the memory array, wherein the group of cells comprises a first cell, a second cell, and a third cell located in a second row of the memory array, wherein the first cell is located adjacent the target cell in a bit line direction, wherein the second cell is located diagonally adjacent the target cell in a first diagonal direction, and wherein the third cell is located diagonally adjacent the target cell in a second diagonal direction different from the first diagonal direction.

22. The apparatus of claim 21, wherein the group of cells comprise a fourth cell and a fifth cell, wherein the fourth and the fifth cells are located in the first row, wherein the fourth cell is located adjacent a first side of the target cell, and wherein the fifth cell is located adjacent a second side of the target cell.

23. The apparatus of claim 21, wherein the target cell is coupled to a first line included in the two lines, and each cell of the group of cells is coupled to a second line included in the two lines, wherein the module is to apply the voltage to the first line to read the target cell, and to apply an additional voltage to the second line to read the group of cells, and wherein the voltage has an initial voltage value greater than an initial voltage value of the additional voltage.

* * * * *